United States Patent
Mack

(10) Patent No.: US 7,377,228 B2
(45) Date of Patent: May 27, 2008

(54) SYSTEM FOR AND METHOD OF GAS CLUSTER ION BEAM PROCESSING

(75) Inventor: Michael E. Mack, Manchester, MA (US)

(73) Assignee: TEL Epion Inc., Billerica, MA (US)

( * ) Notice: Subject to any disclaimer, the term of this patent is extended or adjusted under 35 U.S.C. 154(b) by 759 days.

(21) Appl. No.: 10/667,006

(22) Filed: Sep. 19, 2003

(65) Prior Publication Data

US 2004/0113093 A1 Jun. 17, 2004

Related U.S. Application Data

(60) Provisional application No. 60/412,931, filed on Sep. 23, 2002.

(51) Int. Cl.
*C23C 16/00* (2006.01)
*A61N 5/00* (2006.01)
*G21G 5/00* (2006.01)

(52) U.S. Cl. .............. 118/723 CB; 250/492.1; 250/492.2; 250/492.21; 250/492.22; 250/492.23; 250/492.3

(58) Field of Classification Search ......... 250/492.1, 250/492.2, 492.21, 492.22, 492.23, 492.3; 204/192.3, 192.32, 192.34; 118/723 CB
See application file for complete search history.

(56) References Cited

U.S. PATENT DOCUMENTS

| | | | | |
|---|---|---|---|---|
| 4,361,762 A | 11/1982 | Douglas | ................... | 250/251 |
| 4,916,311 A | 4/1990 | Fuzishita et al. | ........... | 250/251 |
| 5,814,194 A | 9/1998 | Deguchi et al. | ......... | 204/192.1 |
| 5,959,305 A | 9/1999 | Mack et al. | ........... | 250/492.21 |
| 6,331,227 B1 | 12/2001 | Dykstra et al. | .......... | 156/345.1 |
| 6,486,478 B1 | 11/2002 | Libby et al. | ............. | 250/492.1 |
| 6,613,240 B2 | 9/2003 | Skinner et al. | ............... | 216/38 |
| 6,723,998 B2 * | 4/2004 | Bisson et al. | ............... | 250/397 |
| 2002/0130275 A1 | 9/2002 | Mack et al. | ............. | 250/492.1 |

FOREIGN PATENT DOCUMENTS

| | | | |
|---|---|---|---|
| JP | 02-144841 | * | 6/1990 |
| JP | 2000065942 | | 3/2000 |
| WO | WO 02/052608 A2 | * | 7/2002 |

OTHER PUBLICATIONS

Forrester, A. Theodore, Large Ion Beams, pp. 33-41, John Wiley & Sons, NY, 1988.

* cited by examiner

*Primary Examiner*—Rodney G. McDonald
(74) *Attorney, Agent, or Firm*—Burns & Levinson LLP; Jerry Cohen; David W Gomes

(57) ABSTRACT

System and method of gas-cluster ion beam processing is realized by incorporating improved beam and workpiece neutralizing components. Larger GCIB current transport is enabled by low energy electron neutralization of space charge of the GCIB. The larger currents transport greater quantities of gas in the GCIB. A vented faraday cup beam measurement system maintains beam dosimetry accuracy despite the high gas transport load.

23 Claims, 6 Drawing Sheets

SYSTEM FOR AND METHOD OF GAS CLUSTER ION BEAM PROCESSING

CROSS REFERENCE TO RELATED APPLICATIONS

This application claims the benefit of priority to U.S. Provisional Application Ser. No. 60/412,931, filed Sep. 23, 2002, and entitled "Improved Gas Cluster Ion Beam Processing and Apparatus Therefor" which is incorporated herein by reference.

BACKGROUND OF THE INVENTION

The present invention relates generally to the formation of and application of increased-current gas-cluster ion beams (GCIB's) for processing the surfaces of workpieces, and, more particularly to reducing space charge effects in GCIB's, reducing workpiece charging, and to improving the measurement accuracy of GCIB currents and doses.

The use of GCIB's for processing surfaces is known (see for example, U.S. Pat. No. 5,814,194, Deguchi et al.) in the art. For purposes of this discussion, gas clusters are nano-sized aggregates of materials that are gaseous under conditions of standard temperature and pressure. Such clusters typically consist of aggregates of from a few to several thousand molecules loosely bound to form the cluster. The clusters can be ionized by electron bombardment or other means, permitting them to be formed into directed beams of controllable energy. Such ions typically carry positive charges of q×e (where e is the electronic charge and q is an integer greater than or equal to one). The larger-sized clusters are often the most useful because of their ability to carry substantial energy per cluster ion, while yet having only modest energy per molecule. The clusters disintegrate on impact, with each individual molecule carrying only a small fraction of the total cluster energy. Consequently the impact effects of large clusters are substantial, but are limited to a very shallow surface region. This makes ion clusters effective for a variety of surface modification processes, without the tendency to produce deeper subsurface damage characteristic of conventional monomer ion beam processing.

Means for creation of and acceleration of such GCIBs are described in the reference (U.S. Pat. No. 5,814,194) previously cited. Presently available ion cluster sources produce clusters ions having a wide distribution of sizes, N (where N=the number of molecules in each cluster—in the case of monatomic gases like argon, an atom of the monatomic gas will be referred to as a molecule and an ionized atom of such a monatomic gas will be referred to as a molecular ion—or simply a monomer ion—throughout this discussion).

Many useful surface processing effects can be achieved by bombarding surfaces with GCIB's. These processing effects include, but are not necessarily limited to, smoothing, etching, and film growth. In many cases it is found that in order to achieve industrially practical throughputs in such processes, GCIB currents on the order of hundreds to thousands of microamps are required. Space charge effects in ion beams are expected when Poissance as defined by A. T. Forrester in *Large Ion Beams*, Wiley, New York (1987) approaches unity. In the case of a 400 μA beam with an N/q ratio of 5000, the Poissance varies with the GCIB acceleration voltage up to about 0.3 or so depending on exact operating conditions. Accordingly, some space charge beam expansion would be expected and is observed. Particularly at low acceleration voltages, providing a degree of space charge neutralization to the beam by providing a source of low energy electrons enhances the ability to transport larger gas-cluster ion beam currents and reduces beam spot size. In the beamline of a practical production GCIB processing tool, to minimize beam loss due to space charge expansion of the beam, it is useful to keep the beamline as short as practical (~50 cm) and the beam size at the workpiece is nevertheless relatively large (~6 cm). In the prior art, a simple thermionic electron emitter in the vicinity of the beam has been used to provide space charge neutralizing electrons. In order to achieve successful transport of higher beam currents (compared to the typical hundred or so microamps in practical prior art GCIB tools) it is highly desirable to achieve more effective space charge neutralization in the GCIB.

Another important consideration in extending the useful GCIB beam currents to increase processing throughput is the fact that the workpiece can be charged up by the effects of the GCIB bombardment. This is especially important when the workpieces are semiconductor substrates, magnetic memory sensors, or other charge sensitive materials. Workpiece surface charge neutralization is required for successful GCIB processing. In some applications, such as magnetic memory smoothing, the requirements are even more stringent than for semiconductor devices and a maximum surface charging of ±6 volts or even less is required for successful processing. Low energy electrons supplied to the GCIB and the workpiece surface can provide surface charging control as well as GCIB space charge control, but in order to achieve low workpiece charging potentials under varying conditions, such electrons must be low energy. In the past it has not been practical to achieve satisfactory space charge neutralization and to simultaneously control workpiece surface charging at acceptably low potentials. Simple thermionic filament electron sources act as space-charge-limited-diodes, and thus do not readily emit adequate quantities of electrons. It is possible to dramatically reduce the space-charge-limited-diode effect by using an accelerating potential to extract electrons from a thermionic filament's space charge region. This can dramatically increase electron current emission, but results in an increased electron energy problem and in unacceptable risk of workpiece negative charging by energetic electrons if the GCIB should fluctuate momentarily or be momentarily interrupted. Thus, while an accelerated electron source can provide suitably high electron currents, the risk of high energy electrons charging the workpiece make the method unacceptable in many sensitive applications.

For GCIB process control purposes, it is important to be able to measure and control the GCIB intensity. One convenient way of achieving this is by measuring the GCIB current. Faraday cups have traditionally been used as ion beam current measuring devices and are well known in the art of conventional monomer ion beams and have been used successfully for low current GCIB measurement. Inherently, a gas-cluster ion beam transports gas. For an argon beam having a beam current, $I_B$, the gas flow, F (SCCM), in the beam is $$F = 2.23 \times 10^{-18} \left(\frac{N}{q}\right)\left(\frac{I_B}{e}\right) \qquad \text{(Eqn. 1)}$$

With a beam current of 400 μA and an N/q ratio of 5000, the beam conducts a gas flow of 27 SCCM. In a typical GCIB processing tool the ionizer and the workpiece being processed are each typically contained in separate chambers. This provides for better control of the substrate processing pressure. However, a major area of difficulty with beams carrying large amounts of gas occurs in terms of beam current measurement. The entire gas load is released when the cluster beam strikes the inside of the faraday cup. Charge exchange and gas ionization by the beam within the confines of the faraday cup become extreme and significant measurement errors occur with conventional faraday cup designs.

It is therefore an object of this invention to provide a neutralizer capable of providing large neutralizing electron currents but having low electron energy.

It is also an object of this invention to provide a method of effective space charge neutralization of a high current GCIB.

It is a further object of this invention to provide an improved method of limiting the charging of the surface of a workpiece being processed by GCIB.

Another object of this invention is to provide an improved faraday cup for beam current measurement in beams having high gas transport.

A still further object of this invention is to provide a method for accurate measurement of gas-cluster ion beam current in GCIBs transporting large amounts of gas.

SUMMARY OF THE INVENTION

The objects set forth above as well as further and other objects and advantages of the present invention are achieved by the embodiments of the invention described hereinbelow.

An improved GCIB neutralizing apparatus is comprised of an array of one or more thermionic filaments disposed around a GCIB axis. A cylindrical mesh acceleration electrode draws the thermionic electrons away from the filament(s), directing them toward the GCIB axis, helping to overcome the well known space-charge-limited-diode effect. A second cylindrical mesh deceleration electrode decelerates the accelerated electrons, causing them to travel into the GCIB with a very low energy. This acceleration/deceleration (Accel/Decel) electron source provides high electron emission, while delivering the space charge neutralizing electrons with very low energies. Thus, the electrons are especially effective at reducing GCIB space charge effects including the beam expansion problem that otherwise tends to limit the ability to deliver high GCIB currents to the workpiece. Additionally, the low energy electrons are transported by the beam potential-well to the workpiece to neutralize any charging that might otherwise tend to occur at the workpiece. Because copious quantities electrons are available, beam induced charging is minimal. Because the electrons have very low energies due to their Accel/Decel generation, they do not tend to charge the workpiece excessively negatively if the beam momentarily fluctuates. Thus, both positive and negative workpiece charging is limited to less than a few volts. The effective space charge neutralization in the GCIB results in the ability to transport larger GCIB currents. The larger GCIB currents cause an increased mass flow of gas clusters to the workpiece and to the beam current measuring device.

To avoid impairment of beam current measurement accuracy due to the large gas load that is accordingly released in the beam current measuring device, an improved faraday cup is utilized. The improved faraday cup is vented to facilitate the efficient removal of the beam-transported gas by the system's vacuum pumping system. It also has a novel biasing scheme and geometry that reduces measurement errors that would otherwise result. The improved faraday cup is cylindrical and consists of flat disk-electrodes stacked together with gaps between them to allow the beam transported gas to escape. The spacing between the disks is smaller than their radial extent so that electrical suppression fields fill the gaps. The suppression rings nearest the beam strike plate are biased by a supply with the positive terminal connected to the metering circuit. These rings suppress secondary electrons from the target plate and at the same time collect ions produced by charge exchange. Since the bias field needed to suppress to the center of the beam necessitates several kilovolts of bias, secondary ions striking the floating suppression ring set can generate secondary electrons, a portion of which could potentially escape between the rings. To collect these electrons an intermediate ring set is connected to the faraday cup strike plate and a slight negative bias is added on the outside rings opposite these intermediate rings. To encourage gas to escape laterally from the faraday cup, the strike plate incorporates grooving on its surface, preferably concentric circular grooves.

To test the improved faraday cup, a much smaller and more conventional faraday cup with a very narrow slit to limit gas loading was scanned in front of the improved faraday cup and comparative measurements were made. This smaller conventional faraday cup included means for gas removal and its signal was integrated as it scanned across the beam, to determine total current in the beam. The two faraday cups agreed within about 2% with most of the difference attributable to systematic errors in the smaller conventional faraday cup.

For a better understanding of the present invention, together with other and further objects thereof, reference is made to the accompanying drawings and detailed description.

DETAILED DESCRIPTION OF CERTAIN PREFERRED EMBODIMENTS OF THE INVENTION

Figure 1:
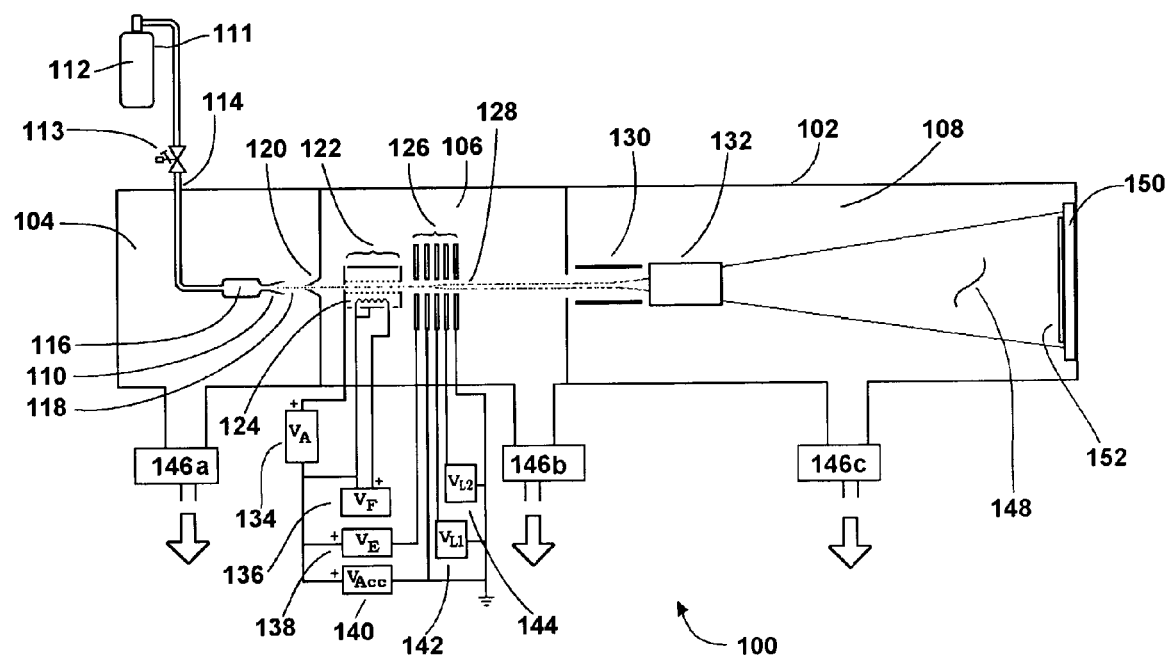
FIG. 1 is a schematic showing the basic elements of a prior art GCIB processing apparatus that uses an electrostatically scanned beam.

Preferred embodiments of the present invention will now be described with reference to the several figures of the drawing.

FIG. 1 shows a schematic of the basic elements of a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each comprised of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128. Filament power supply 136 provides voltage $V_F$ to heat the ionizer filament 124. Anode power supply 134 provides voltage $V_A$ to accelerate thermoelectrons emitted from filament 124 to cause them to irradiate the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{ACC}$ to bias a high voltage electrode with respect to the ionizer 122 so as to result in a total GCIB acceleration energy equal to $V_{ACC}$ electron volts (eV). One or more lens power supplies (142 and 144 shown for example) may be provided to bias high voltage electrodes with potentials ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
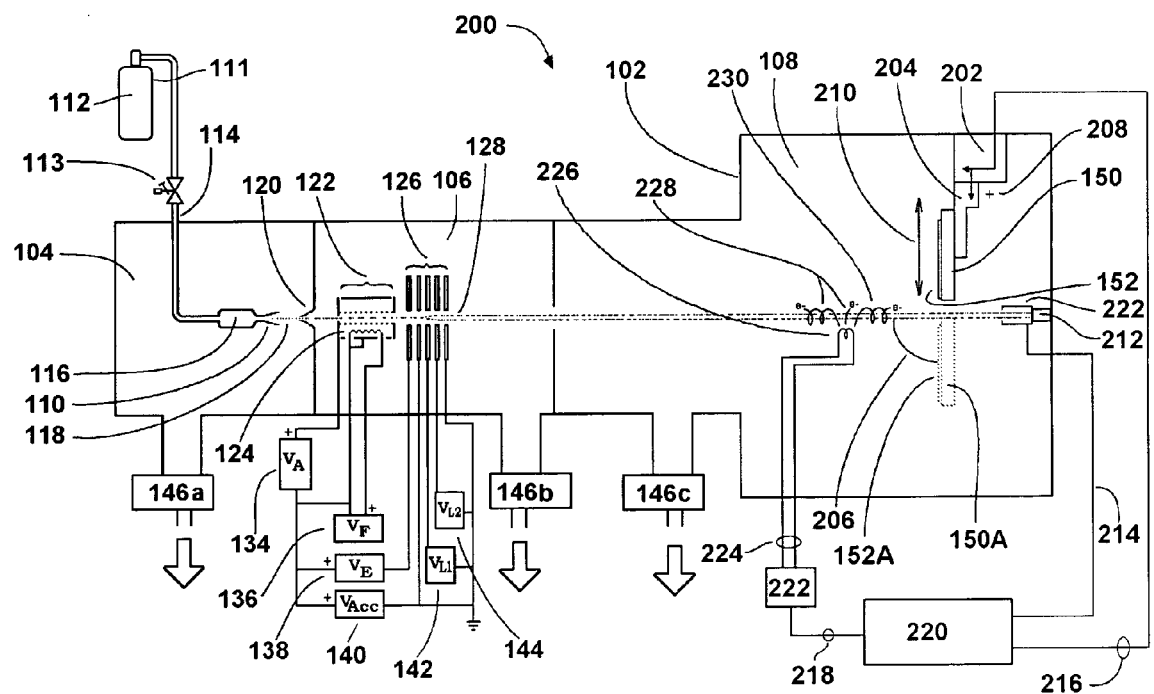
FIG. 2 is a schematic showing the basic elements of a prior art GCIB processing apparatus that uses a stationary beam with mechanical scanning of the workpiece, and having a conventional faraday cup and a conventional thermionic neutralizer.

FIG. 2 shows a schematic of the basic elements of a prior art GCIB processing apparatus 200 having a stationary beam with a mechanically scanned workpiece 152, and having a conventional faraday cup for beam measurement and a conventional thermionic neutralizer. GCIB formation is similar to as is shown in FIG. 1, but in the mechanically scanning GCIB processor 200 of FIG. 2, the GCIB 128 is stationary (not scanned) and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or very near 90 degrees. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 2, similar scanning and over-scan is performed in the (typically) orthogonal X-scan motion 208 direction (in and out of the plane of the paper).

A beam current sensor 222 is disposed beyond the workpiece holder 150 in the path of the GCIB 128 so as to intercept a sample of the GCIB 128 when the workpiece holder 150 is scanned out of the path of the GCIB 128. The beam current sensor 222 is typically a faraday cup or the like, closed except for a beam-entry opening, and is affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 220 receives the sampled beam current collected by the beam current sensor 222 by way of lead 214 and thereby monitors the GCIB and controls the GCIB dose received by the workpiece 152 by removing the workpiece 152 from the GCIB 128 when a predetermined desired dose has been delivered.

Figure 3:
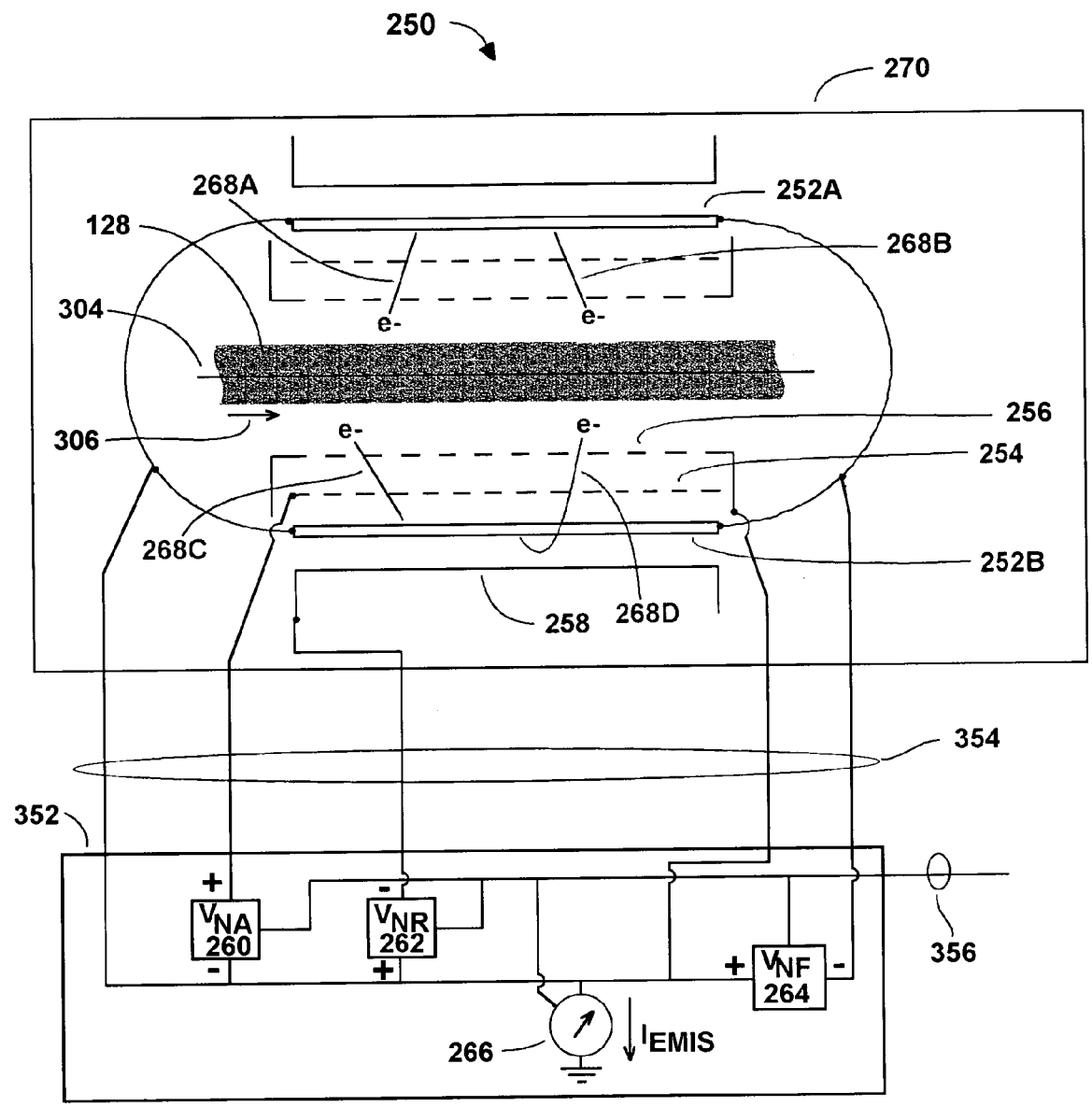
FIG. 3 is a schematic showing the improved neutralizer of the invention and its supporting electronic systems.
Figure 4:
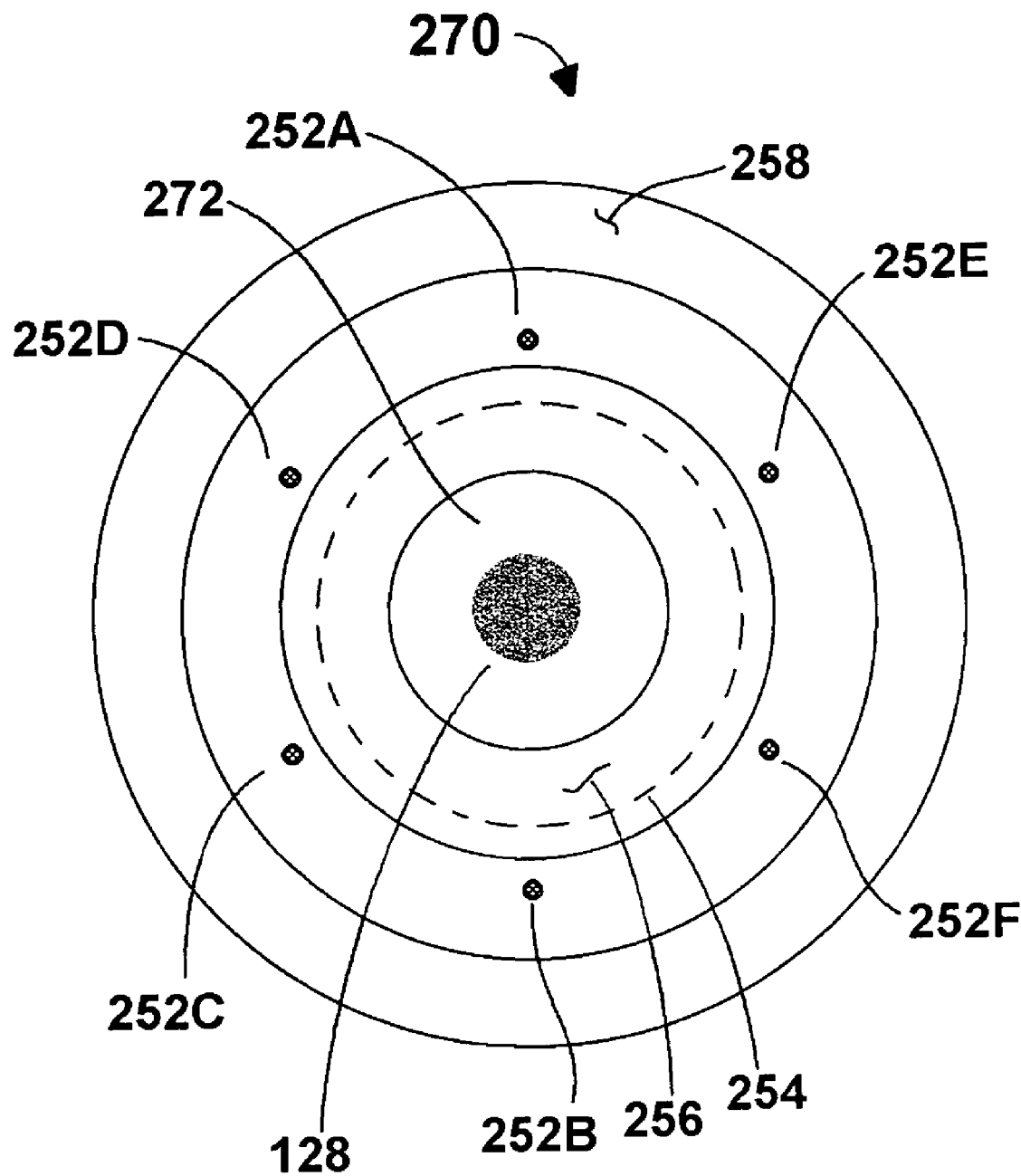
FIG. 4 is a schematic of an end view of the improved neutralizer of the invention (looking in the direction of GCIB travel)

FIG. 3 shows a schematic 250 illustrating an improved neutralizer 270 provided by the present invention and an associated neutralizer electronic system 352 containing supporting power supplies, measurement, and data communication and control cables. Improved neutralizer 270 is disposed so as to surround the beam axis 304 of GCIB 128. GCIB 128 travels through the neutralizer in the direction 306. The improved neutralizer 270 comprises three substantially concentric electrodes and an array of one or more thermionic filaments. In FIG. 3, the improved neutralizer 270 is shown schematically in longitudinal section view. Although 3 to 6 filaments are preferably employed, in FIG. 3, two filaments 252A and 252B are shown to facilitate viewing and understanding. FIG. 4 illustrates a possible arrangement for a 6-filament embodiment. Referring again to FIG. 3, neutralizer electron acceleration electrode 254 is an approximately cylindrical, electrically conductive mesh with high transparency, preferably 90% transparent or more. Neutralizer electron deceleration electrode 256 is a second approximately cylindrical, electrically conductive mesh with high transparency, preferably 90% transparent or more. Neutralizer electron repeller electrode 258 is a third approximately cylindrical, electrically conductive electrode. Electrodes 256, 254, and 258 are substantially concentric, approximately centered on nominal beam axis 304.

Neutralizer electronic system 352 contains neutralizer filament power supply 264, which provides neutralizer filament power supply voltage $V_{NF}$. The negative terminal of neutralizer filament power supply 264 is connected via an electrical lead in cable 354 to the negative ends of filaments 252A and 252B (for example). The positive terminal of neutralizer filament power supply 264 is connected via electrical leads in cable 354 to the positive ends of filaments 252A and 252B (for example) and to neutralizer electron deceleration electrode 256. The positive terminal of neutralizer filament power supply 264 is also connected via electrical leads to the positive terminal of neutralizer electron repeller electrode bias power supply 262 and to the negative terminal of neutralizer electron acceleration power supply 260 and to a terminal of neutralizer emission current transducer/indicator 266. The negative terminal of neutralizer electron repeller electrode bias power supply 262 is connected via an electrical lead in cable 354 to neutralizer electron repeller electrode 258. The positive terminal of neutralizer electron acceleration power supply 260 is connected via an electrical lead in cable 354 to neutralizer electron acceleration electrode 254.

Neutralizer filament power supply voltage $V_{NF}$ is typically a few volts and is chosen to heat the filaments to incandescence for thermionic emission of electrons. Filament diameters are chosen to be such that less than 10 volts (preferably less than 6 volts) is dropped across the filaments. Thus, $V_{NF}$ is less than 10 volts (preferably less than 6 volts). Electrons (symbolized e-) 268A, 268B, and 268C (shown for example) emitted by the filaments 252A and 252B are attracted and accelerated by neutralizer electron acceleration electrode 254, which extracts them from the space charge cloud surrounding the filaments 252A and 252B, increasing the electron emission well beyond the space-charge-limited-diode condition that would otherwise prevail. Between the neutralizer electron acceleration electrode 254 and the neutralizer electron deceleration electrode 256 the electron is decelerated. Since the neutralizer electron deceleration electrode 256, is biased with the potential of the positive end of the filaments 252A and 252B, the electron are decelerated to thermal energy plus, at most, $V_{NF}$, that is less than 10 (preferably less than 6) electron volts. When $V_{NF}$ is less than 6 volts, the extracted electrons do not charge surfaces they strike in excess of approximately 6 volts.

Neutralizer electron repeller electrode bias voltage $V_{NR}$ is approximately 120 volts (for example) and biases the neutralizer electron repeller electrode 258 so as to cause any electrons 268D (symbolized e-) emitted in a direction away from the GCIB 128 to be reflected back toward the GCIB 128 so as to be accelerated and then decelerated into the beam path. Electrons, which pass through the beam, enter the grids on the opposite side and are re-circulated back through the beam.

Neutralizer electron acceleration power supply 260 provides neutralizer electron acceleration voltage $V_{NA}$ and is approximately 50 to 250 volts (for example). It biases the neutralizer electron acceleration electrode 254 so as to extract electrons from the space charge cloud surrounding the filaments 252A and 252B.

Neutralizer emission current transducer/indicator 266 measures the total emission current of the filaments, $I_{EMIS}$. With two or three filaments of approximately 10 cm length, emission currents of several milliamps of low energy electrons can be achieved, more than enough to effectively space charge neutralize GCIBs of at least several hundred microamps. After orbiting within the neutralizer, these electrons escape through the ends of the neutralizer cylinder and travel along the beam potential well to provide space charge neutralization up- and down-stream. The down-stream current is also available for minimizing workpiece charging during GCIB processing.

Neutralizer electron acceleration power supply 260, neutralizer electron repeller electrode bias power supply 262, neutralizer filament power supply 264, and neutralizer emission current transducer/indicator 266 are all preferably remotely controllable and readable instruments or circuits and may communicate data and control signals with a higher level system controller. They have their control and data connections supplied to such higher level system controller by electrical connections in cable 356.

FIG. 4 shows a schematic of an end view of the improved neutralizer 270 of the invention (looking in the direction of GCIB 128 travel). This view clarifies that the improved neutralizer 270 electrodes are substantially cylindrical and substantially concentric. In this figure, a case of six filaments 252A, 252B, 252C, 252D, 252E, and 252F is illustrated. The filaments are seen in end view in this figure and are typically (though not necessarily) parallel to the GCIB 128 (also seen in end view in this figure). The improved neutralizer 270 has a clear aperture 272 for beam transmission. It is recognized that other quantities of filaments are practical, with two to sixteen being preferred. When there are multiple filaments it is preferable to dispose them equally spaced on the circumference of a mounting circle (as shown in this figure for a case of six filaments).

Figure 5:
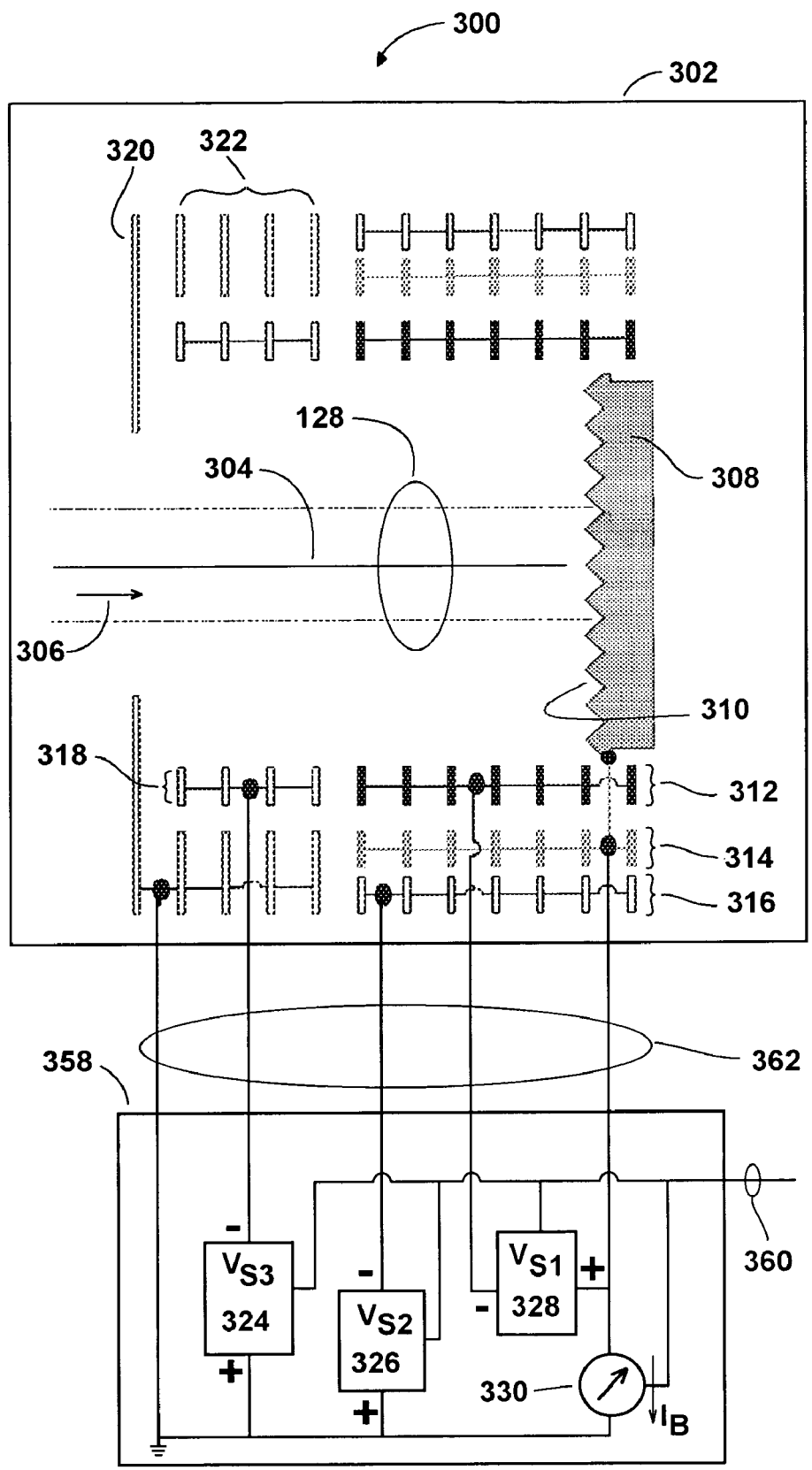
FIG. 5 is a schematic of the improved faraday cup of the invention and its supporting electronics.

FIG. 5 shows a schematic 300 of the improved faraday cup 302 of the invention and its associated faraday cup electronic system 358 including power supplies and measurement electronics. The improved faraday cup 302 is a vented faraday cup with novel biasing to assure accuracy of beam current measurements for GCIBs that transport a high gas load to the faraday cup.

The improved faraday cup 302 is cylindrical, substantially concentric with the GCIB beam axis 304, and consists of several sets of flat disks stacked with gaps between them to allow the GCIB-transported gas to escape. The disks are held and maintained in their proper positions with insulating supports, not shown in FIG. 5. The GCIB 128, traveling in direction 306, enters through the opening in the defining aperture 320 and strikes a circular beam strike plate 308. Strike plate 308 is grooved with a series of saw-tooth grooves 310, which are preferably circular grooves concentric with the beam axis 304. These grooves facilitate lateral direction of the gas deposited on the strike plate by the GCIB 128. The beam strike plate 308 is electrically connected via a lead in cable 362 to the beam current ($I_B$) measurement system 330. The beam current, $I_B$, flows through the measurement system 330 to ground. The conventional beam current measurement system 330 maintains the strike plate 308 potential at a virtual ground potential.

The flat concentric disks that form the faraday cup are arranged and electrically connected in several groups. The group of suppression rings 312 nearest the strike plate 308 are biased negative with respect to the beam strike plate by a floating (isolated from ground) power supply 328 by a potential $V_{S1}$. The positive terminal of power supply 328 is connected to the beam strike plate 308. This group of suppression rings 312 suppress secondary electrons from the beam strike plate 308 and at the same time collect positive ions produced by charge exchange between the GCIB and the gas in the faraday cup. Since the bias field needed to suppress to the center of the beam necessitates several kilovolts of bias ($V_{S1}$ is for example about 3.5 kV), ions striking the group of suppression rings 312 may generate secondary electrons, a portion of which could potentially escape between the rings of the group of suppression rings 312. To collect these electrons an intermediate group of suppression rings 314 is connected to the beam strike plate 308. A third group of suppression rings 316 has a small negative bias, $V_{S2}$ applied by power supply 326. The group of suppression rings 316 is outermost and returns any secondary electrons escaping the group of suppression rings 312 to the group of suppression rings 314. Generally, the correction due to these secondary electrons is small and in some cases it may be acceptable to eliminate power supply 326 by instead grounding the group of suppression rings 316. When power supply 326 is used, $V_{S2}$ may typically be set at about 50 volts.

Power supply 324 provides voltage $V_{S3}$ to bias a fourth group of suppression rings 318 negative by several kilovolts ($V_{S3}$ is typically about 3.5 kV). This bias prevents secondary electrons from the beam strike plate 308 from escaping the faraday cup and prevents electrons outside of the faraday cup from entering. The entrance defining aperture 320 and the group of rings 322 are all grounded via an electrical lead in cable 362 and serve to terminate the electric field from the group of suppression rings 318.

The negative terminal of power supply 324 connects to group of suppression rings 318 via an electrical lead in cable 362. The negative terminal of power supply 326 connects to group of suppression plates 316 via an electrical lead in cable 362. Power supply 324, power supply 326, power supply 328, and beam current measurement system 330 are all preferably remotely controllable and readable instruments or circuits and may communicate data and control signals with a higher level system controller. They have their control and data connections made available to such higher level system controller by electrical connections in cable 360.

Figure 6:
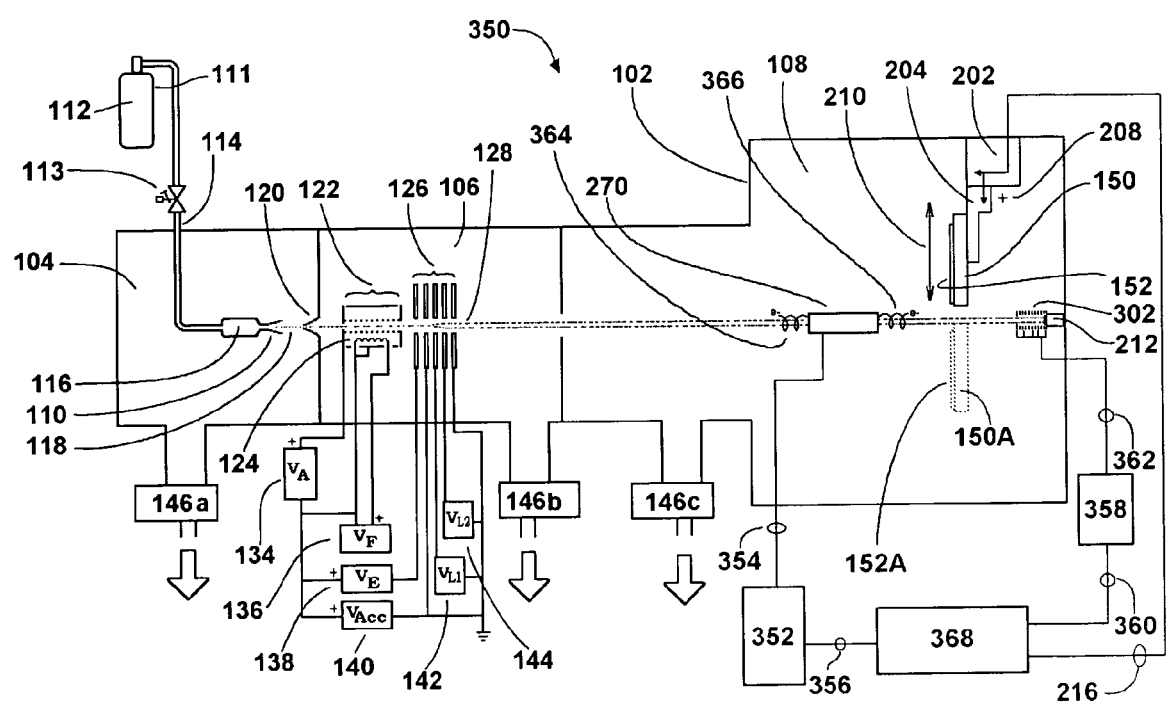
FIG. 6 is a schematic of the improved GCIB processing system of the invention, including the improved neutralizer and the improved faraday cup for beam measurement.

FIG. 6 shows a schematic of the improved GCIB processing system 350 of the invention, including the improved neutralizer 270 and the improved faraday cup 302 as well as their associated support electronics. GCIB formation, mechanical scanning, and other general features are similar to as shown in the prior art of FIG. 2.

The improved faraday cup 302 is disposed beyond the workpiece holder 150 in the path of the GCIB 128 so as to intercept a sample of the GCIB 128 when the workpiece holder 150 is scanned out of the path of the GCIB 128. The improved faraday cup 302 is affixed to the wall of the vacuum vessel 102 with an electrically insulating mount 212. A cable 362 provides the electrical connections between the improved faraday cup 302 and its associated faraday cup electronic system 358.

A controller 368, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 368 receives the sampled beam current collected by the improved faraday cup 302 beam current sensor and its associated faraday cup electronic system 358 including power supplies and measurement electronics. The controller 368 receives the current measurement data and sends control signals to the faraday cup electronic system 358 via electrical cable 360. Controller 368 thereby monitors the GCIB and controls the GCIB dose received by the workpiece 152 by removing the workpiece 152 from the GCIB 128 when a predetermined desired dose has been delivered.

Controller 368 receives the measured neutralizer emission current, $I_{EMIS}$, provided by the improved neutralizer 270 and measured by the neutralizer electronic system 352 via signals on electrical cable 356. Controller 368 also controls the power supplies in the neutralizer electronic system 352 via signals on electrical cable 356, and thus controls the operation of the improved neutralizer. Electrons (364 and 366 for example), symbolized as e-, escape the improved neutralizer along the GCIB 128 and travel up- and down-stream providing GCIB space charge neutralization to improve beam transport and increase available beam current at the workpiece. Electrons (366 for example) traveling along the GCIB 128 in the down-stream direction and having low energy travel to the workpiece and provide a copius source (potentially greater than the GCIB current) of low energy neutralizing electrons to reduce or eliminate workpiece charging during beam processing. The actual amount of electrons traveling to the workpiece is determined by the electrostatic attraction of electrons from the beam due to the onset of workpiece charging.

Although the invention has been described with respect to various embodiments, it should be realized this invention is also capable of a wide variety of further and other embodiments within the spirit of the invention.

I claim:

1. A low energy electron source for at least partially neutralizing space charge of a gas cluster ion beam, comprising:
   one or more filaments for emitting electrons;
   a filament power supply for biasing said one or more filaments to induce low energy electron emission;
   an anode electrode for accelerating said electrons away from the one or more filaments and toward a gas cluster ion beam having an axis so as to have a neutralizing effect on the space charge of said gas cluster ion beam;
   an acceleration power supply for biasing said anode electrode with respect to said one or more filaments;
   a deceleration electrode for decelerating said accelerated electrons; and
   wherein said one or more filaments each have a positively biased end and a negatively biased end and further wherein said deceleration electrode is directly connected to the positively biased end of said one or more filaments.

2. The low energy electron source of claim 1, wherein:
   the deceleration electrode is substantially cylindrical and substantially coaxial with the gas cluster ion beam axis, and is disposed between the anode electrode and the gas cluster ion beam; and
   the anode electrode is substantially cylindrical and substantially coaxial with the gas cluster ion beam axis, and is disposed between said one or more filaments and the gas cluster ion beam.

3. The low energy electron source of claim 2, wherein the deceleration electrode includes an aperture for transmitting the gas cluster ion beam.

4. The low energy electron source of claim 2, further comprising:
a substantially cylindrical electron reflecting electrode that is substantially coaxial with the gas cluster ion beam axis;
a power supply for biasing the electron reflecting electrode with respect to said one or more filaments; and wherein,
the one or more filaments are disposed between the electron reflecting electrode and the acceleration electrode, and
the electron reflecting electrode is biased so as to reflect electrons toward the acceleration electrode.

5. The low energy electron source of claim 2, wherein:
at least a portion of the anode electrode comprises an electrically conductive mesh with an electron transparency of 90 per cent or more; and
at least a portion of the deceleration electrode comprises an electrically conductive mesh with an electron transparency of 90 per cent or more.

6. The low energy electron source of claim 2, wherein the decelerated electrons have energies of less than 10 electron volts.

7. The low energy electron source of claim 2, wherein the one or more filaments comprise two or more filaments disposed substantially parallel to the gas cluster ion beam axis and substantially equally spaced about the gas cluster ion beam.

8. A vented faraday cup, comprising:
an electrically conductive strike plate having a surface for receiving a gas cluster ion beam;
a vented enclosure surrounding and extending in front of the strike plate so as to define a cup, said enclosure comprised of a plurality of substantially coaxial electrically conductive ring electrodes disposed with gaps between the ring electrodes;
an electrical conductor for conducting the current collected by the strike plate to a current measuring system; and
wherein said plurality of electrically conductive ring electrodes are arranged and electrically connected in at least three groups of at least two ring electrodes, each group independently electrically biased so as to minimize undesired charged particle leakage into or out of the cup.

9. The vented faraday cup of claim 8, wherein the surface of the electrically conductive strike plate includes saw-tooth grooves.

10. The vented faraday cup of claim 8, wherein
a group of electrically conductive ring electrodes nearest the electrically conductive strike plate is biased negatively with respect to the strike plate; and
one or more of the at least three groups of electrically conductive ring electrodes is biased at the potential of the electrically conductive strike plate.

11. The vented faraday cup of claim 8, wherein
a group of electrically conductive ring electrodes nearest the electrically conductive strike plate is biased at a first negative potential with respect to the strike plate;
one or more of the at least three groups of electrically conductive ring electrodes is biased at the potential of the electrically conductive strike plate; and
at least one of the at least three groups of electrically conductive ring electrodes is biased at a second negative potential with respect to the strike plate.

12. The vented faraday cup of claim 9, wherein:
the electrically conductive strike plate is substantially circular;
the multiple electrically conductive ring electrodes are substantially circular;
the saw-tooth groves are substantially circular; and
the electrically conductive strike plate and the multiple electrically conductive ring electrodes and the saw-tooth groves are all substantially concentric with an axis of the gas cluster ion beam.

13. The vented faraday cup of claim 8, wherein the gaps between adjacent electrically conductive ring electrodes are smaller than the annular radial extent of the adjacent ring electrodes.

14. An improved system for gas cluster ion beam processing of surfaces of workpieces, comprising:
a vacuum chamber;
a gas cluster ion beam source disposed within the vacuum chamber for forming a gas cluster ion beam, said gas cluster ion beam having a beam axis;
a workpiece holder for holding a workpiece within the vacuum chamber and for placing the workpiece into the gas cluster ion beam for processing and for removing the workpiece from the gas cluster ion beam to terminate processing;
a low energy electron source within the vacuum chamber for neutralizing or partially neutralizing the space charge of the gas cluster ion beam; and
a vented faraday cup within the vacuum chamber for collecting the gas cluster ion beam current for measurement to control the processing of the workpiece;
wherein the vented faraday cup comprises:
an electrically conductive strike plate having a surface for receiving the gas cluster ion beam;
a vented enclosure surrounding and extending in front of the strike plate and comprising a multiplicity of electrically conductive ring electrodes disposed with gaps between the ring electrodes;
an electrical conductor for conducting the current collected by the faraday cup to a current measuring system; and wherein
said multiplicity of electrically conductive ring electrodes are arranged and electrically connected in at least three groups that are independently electrically biased for minimizing undesired charged particle leakage into or out of the faraday cup, and
each of the at least three groups of electrically connected ring electrodes comprises two or more ring electrodes.

15. The system for gas cluster ion beam processing of claim 14, wherein the low energy electron source comprises:
one or more filaments for emitting electrons;
an anode electrode for accelerating said electrons away from the one or more filaments and toward the gas cluster ion beam;
a deceleration electrode for decelerating said accelerated electrons;
a filament power supply for biasing said one or more filaments to induce electron emission;
an acceleration power supply for biasing said anode electrode with respect to said one or more filaments; and
means for biasing said deceleration electrode with respect to said one or more filaments.

16. The system for gas cluster ion beam processing of claim 14, wherein the gas cluster ion beam current is greater than 300 microamperes or wherein the gas cluster ion beam releases a gas flow greater than 20 standard cubic centimeters per minute at the strike plate of the faraday cup.

17. An improved system for gas cluster ion beam processing of surfaces of workpieces, comprising:
a vacuum chamber;
a gas cluster ion beam source disposed within the vacuum chamber for forming a gas cluster ion beam, said gas cluster ion beam having a beam axis;
a workpiece holder for holding a workpiece in the path of the gas cluster ion beam within the vacuum chamber for processing;
a low energy electron source within the vacuum chamber for at least partially neutralizing the space charge of the gas cluster ion beam; and
a vented faraday cup within the vacuum chamber for collecting the gas cluster ion beam current for measurement to control the processing of the workpiece, wherein the vented faraday cup comprises:
an electrically conductive strike plate having a surface for receiving a gas cluster ion beam;
a vented enclosure surrounding and extending in front of the strike plate so as to define a cup, said enclosure comprised of a plurality of substantially coaxial electrically conductive ring electrodes disposed with gaps between the ring electrodes;
an electrical conductor for conducting the current collected by the strike plate to a current measuring system; and
wherein said plurality of electrically conductive ring electrodes are arranged and electrically connected in at least three groups of at least two ring electrodes, each group independently electrically biased so as to minimize undesired charged particle leakage into or out of the cup.

18. The system for gas cluster ion beam processing of claim 17, wherein the low energy electron source comprises:
one or more filaments for emitting electrons;
an anode electrode for accelerating said electrons away from the one or more filaments and toward the gas cluster ion beam;
a deceleration electrode for decelerating said accelerated electrons;
a filament power supply for biasing said one or more filaments to induce electron emission;
an acceleration power supply for biasing said anode electrode with respect to said one or more filaments; and
means for biasing said deceleration electrode with respect to said one or more filaments.

19. The system of claim 17, wherein the vented Faraday cup is adapted to facilitate escape of gas in directions lateral to the beam axis.

20. The system of claim 17, wherein the vented Faraday cup includes an electrically conductive strike plate having a surface for receiving a gas cluster ion beam, and a vented enclosure surrounding and extending in front of the strike plate so as to define a cup, said enclosure comprised of a plurality of substantially coaxial electrically conductive ring electrodes disposed with gaps between the ring electrodes.

21. A vented Faraday cup, comprising:
an electrically conductive strike plate having a surface for receiving a gas cluster ion beam; and
a vented enclosure surrounding and extending in front of the strike plate so as to define a cup having an open end adapted to receive a gas cluster ion beam;
wherein the surface of the electrically conductive strike plate includes saw-tooth grooves.

22. The Faraday cup of claim 21, wherein the vented enclosure is adapted to facilitate escape of gas in directions lateral to an axis of the gas cluster ion beam.

23. A vented Faraday cup, comprising:
an electrically conductive strike plate having a surface for receiving a gas cluster ion beam; and
a vented enclosure surrounding and extending in front of the strike plate so as to define a cup having an open end adapted to receive a gas cluster ion beam;
wherein the vented enclosure comprises a plurality of substantially coaxial, electrically conductive ring electrodes disposed with gaps between the ring electrodes, and
further wherein said plurality of ring electrodes are arranged and electrically connected in at least three groups of at least two ring electrodes, each group adapted for independent electrical biasing to minimize undesired charged particle leakage into or out of the cup.

* * * * *